(12) United States Patent
Shin et al.

(10) Patent No.: US 8,247,324 B2
(45) Date of Patent: Aug. 21, 2012

(54) SEMICONDUCTOR DEVICE WITH BURIED GATE AND METHOD FOR FABRICATING THE SAME

(75) Inventors: Jong-Han Shin, Gyeonggi-do (KR); Jum-Yong Park, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 175 days.

(21) Appl. No.: 12/827,385

(22) Filed: Jun. 30, 2010

(65) Prior Publication Data

US 2011/0156262 A1 Jun. 30, 2011

(30) Foreign Application Priority Data

Dec. 30, 2009 (KR) .................. 10-2009-0134849

(51) Int. Cl.
*H01L 21/44* (2006.01)

(52) U.S. Cl. . 438/672; 438/675; 438/629; 257/E29.112; 257/E21.649; 257/773

(58) Field of Classification Search .................. 438/672, 438/675, 629; 257/E21.158, E21.649, E29.112, 257/773

See application file for complete search history.

(56) References Cited

FOREIGN PATENT DOCUMENTS

| KR | 1020070060352 | 6/2007 |
|----|---------------|--------|
| KR | 100819001 | 4/2008 |

OTHER PUBLICATIONS

Notice of Preliminary Rejection issued from Korean Intellectual Property Office on May 23, 2011.

*Primary Examiner* — Jarrett Stark
(74) *Attorney, Agent, or Firm* — IP & T Group LLP

(57) ABSTRACT

A method for fabricating a semiconductor device includes forming landing plugs over a substrate, forming a trench by etching the substrate between the landing plugs, forming a buried gate to partially fill the trench, forming a gap-fill layer to gap-fill an upper side of the buried gate, forming protruding portions of the landing plugs, and trimming the protruding portions of the landing plugs.

12 Claims, 9 Drawing Sheets

SEMICONDUCTOR DEVICE WITH BURIED GATE AND METHOD FOR FABRICATING THE SAME

CROSS-REFERENCE TO RELATED APPLICATION

The present application claims priority of Korean Patent Application No. 10-2009-0134849, filed on Dec. 30, 2009, which is incorporated herein by reference in its entirety.

BACKGROUND OF THE INVENTION

Exemplary embodiments of the present invention relate to a method for fabricating a semiconductor device, and more particularly, to a semiconductor device with a buried gate and a method for fabricating the same.

In a sub 60-nanometer (nm) DRAM process, it may be advantageous to form a buried gate in order to increase the integration degree of transistors in a cell, simplify the process, and improve device characteristics such as a leakage characteristic.

A method for fabricating the buried gate is performed by forming a trench and burying a gate in the trench. Therefore, the interference between a bit line and the gate may be minimized, and the number of films to be stacked may be reduced. Furthermore, the capacitance of the cells may be reduced to thereby improve a refresh characteristic.

In general, after a buried gate is formed in a cell region, a sealing process may be performed for sealing the upper side of the buried gate using a gap-fill layer. A gate oxidation process and a gate conductive layer formation process may be performed to form a transistor of a peripheral circuit region by exposing only the peripheral circuit region. A contact etching process and a bit-line (BL) process may be performed to form a bit-line contact hole by exposing the cell region.

In this method, however, since a storage node contact hole is formed after the bit line is formed in the cell region, it is difficult to obtain an exposed contact area for forming the storage node contact hole. Furthermore, since the exposed contact area is narrow, interfacial resistance between a storage node contact and a substrate may increase.

In particular, when the process is performed on the basis of a design rule of $6F^2$, an active region in which a bit-line contact hole is to be formed should ideally be completely covered by the bit line. Therefore, when the area of the bit line is increased, an exposed contact margin for forming the storage node contact hole is further decreased.

To increase the process margin of the storage node contact hole, the storage node contact hole and the storage node contact may be formed before the bit line is formed. In order to prevent a bridge between the bit line and the storage node contact, the bit line should ideally be formed as large as possible. In this case, however, the area of the storage node contact is reduced to cause an increase in contact resistance.

SUMMARY OF THE INVENTION

Exemplary embodiments of the present invention are directed to a semiconductor device which may prevent a bridge between a storage node contact and a bit line and a method for fabricating the same.

In accordance with an exemplary embodiment of the present invention, a method for fabricating a semiconductor device includes forming landing plugs over a substrate, forming a trench by etching the substrate between the landing plugs, forming a buried gate to partially fill the trench, forming a gap-fill layer to gap-fill an upper side of the buried gate, forming protruding portions of the landing plugs, and trimming the protruding portions of the landing plugs.

In accordance with another exemplary embodiment of the present invention, a method for fabricating a semiconductor device includes forming landing plugs over a substrate, forming a trench by etching the substrate between the landing plugs, forming a buried gate to partially fill the trench, forming a first gap-fill layer to gap-fill an upper side of the buried gate, forming protruding portions of the landing plugs, trimming the protruding portions of the landing plugs, forming a spacer dielectric layer over the entire surface including the trimmed landing plugs, forming a second gap-fill layer over the spacer dielectric layer, and planarizing the second gap-fill layer and the spacer dielectric layer to expose surfaces of the trimmed landing plugs.

In accordance with yet another exemplary embodiment of the present invention, a semiconductor device includes a substrate having a trench arranged therein, a buried gate partially filling the trench, gap-fill layers arranged over the buried gate and protruding from a surface of the substrate, and a landing plug having a buried portion arranged over the substrate between gap-fill layers and a protruding portion arranged on the buried portion.

DESCRIPTION OF EXEMPLARY EMBODIMENTS

Figure 1:
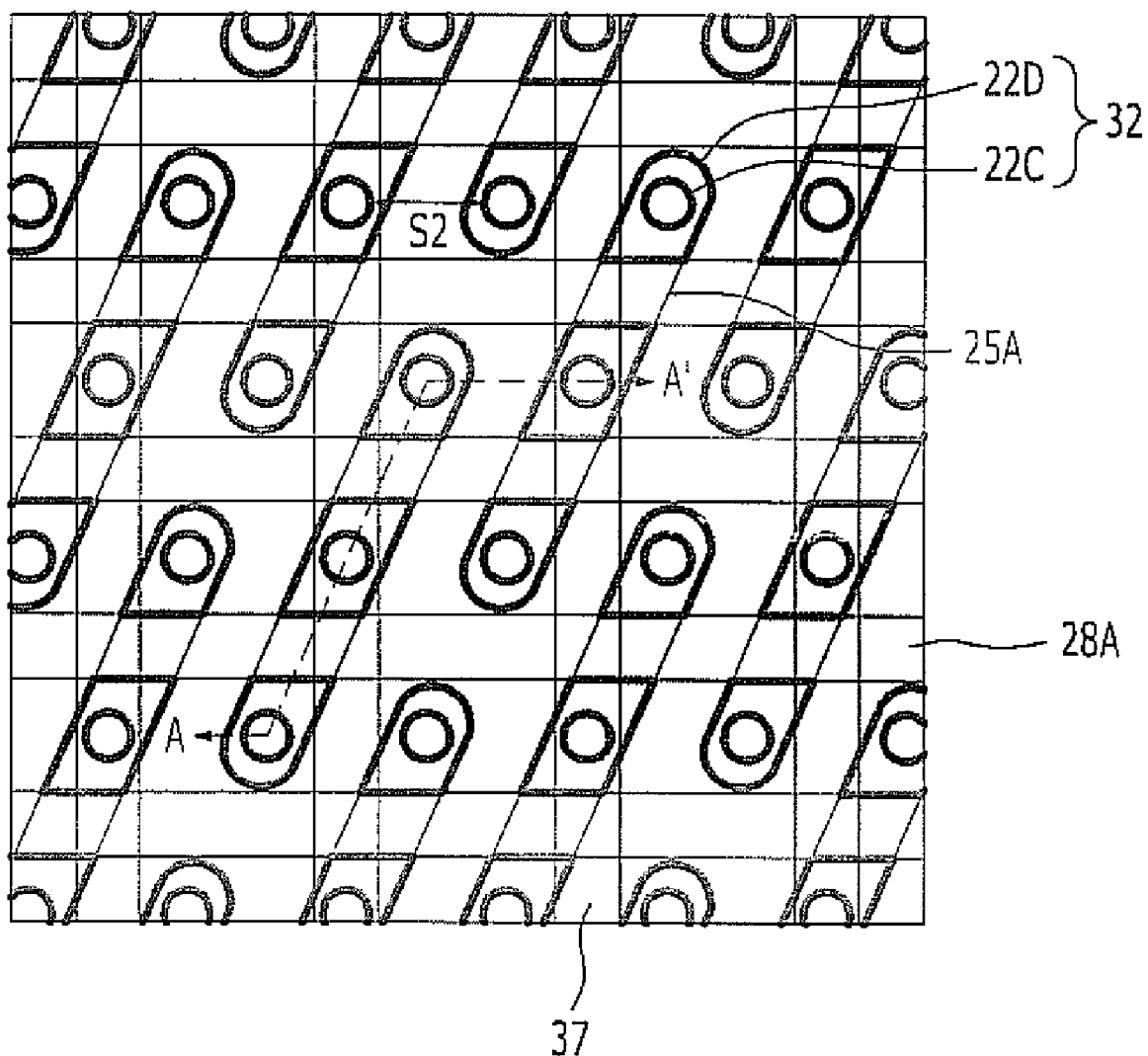
FIG. 1 is a plan view of a semiconductor device in accordance with an exemplary embodiment of the present invention.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a plan view of a semiconductor device in accordance with an exemplary embodiment of the present invention.

Referring to FIG. 1, a buried gate 28A may be formed in an active region 25A. Landing plugs 32 may be formed on the active region 25A. Each of the landing plugs 32 has a buried portion 22D and a protruding portion 22C. The landing plugs 32 may be formed on the active region 25A between the buried gates 28A. The landing plugs 32 may include a landing plug in which a bit line contact is to be formed and a landing plug in which a storage node contact is to be formed. A bit line 37 may be formed in a direction crossing the buried gate 28A.

Referring to FIG. 1, the protruding portion 22C has a smaller area than the buried portion 22D. Accordingly, a space S2 between the protruding portions 22C is relatively large.

As described above, since the space S2 between the protruding portions 22C is large, it is possible to minimize a bridge between a bit line contact hole and a storage node contact hole. Accordingly, the process margin of the bit line contact hole and storage node contact hole process may be improved.

Figure 2A:
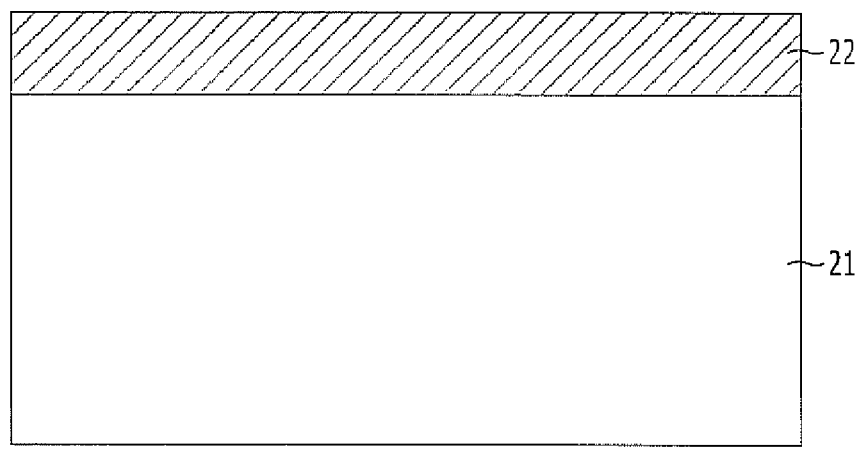
FIGS. 2A to 2N are cross-sectional views illustrating a method for fabricating a semiconductor device in accordance with another exemplary embodiment of the present invention.
Figure 2B:
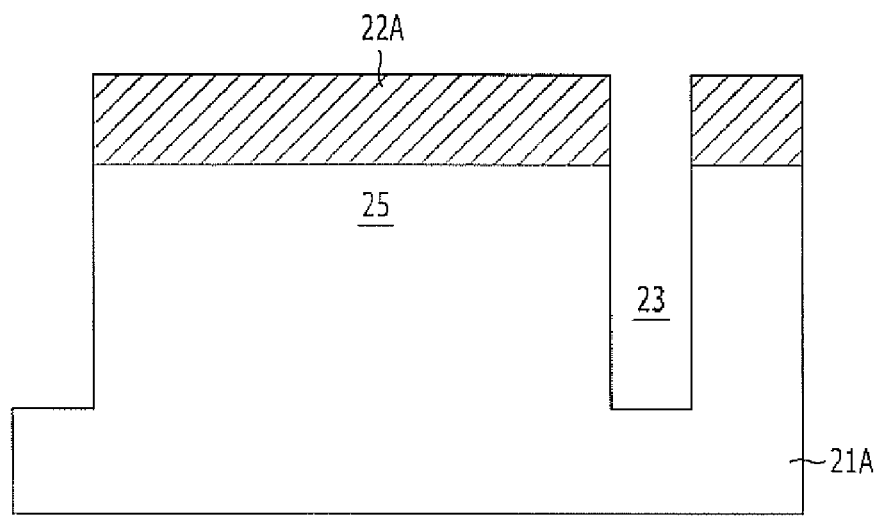
Figure 2C:
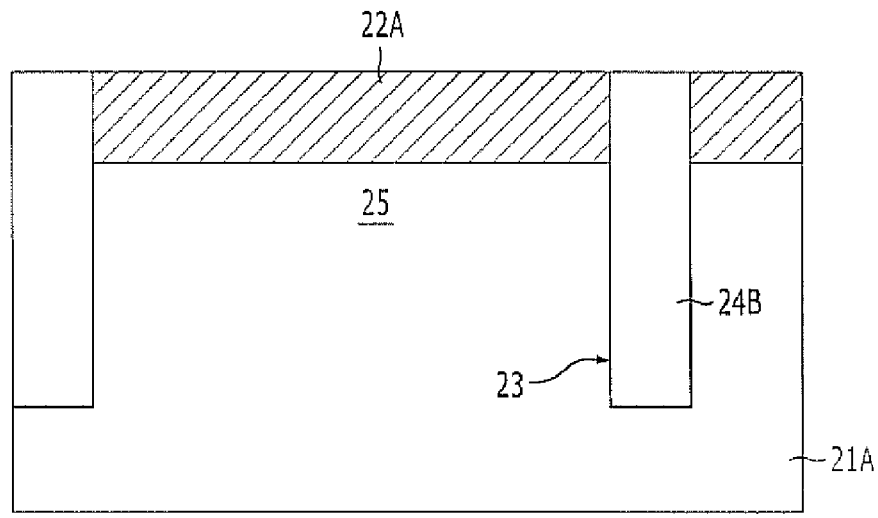
Figure 2D:
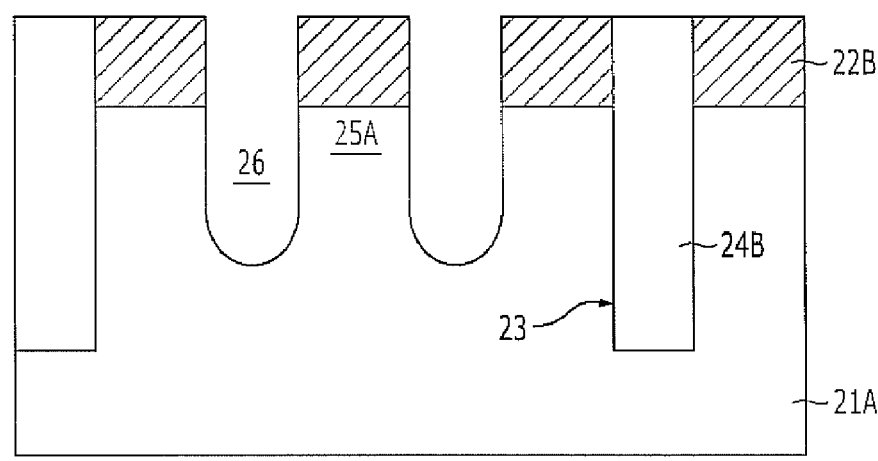
Figure 2E:
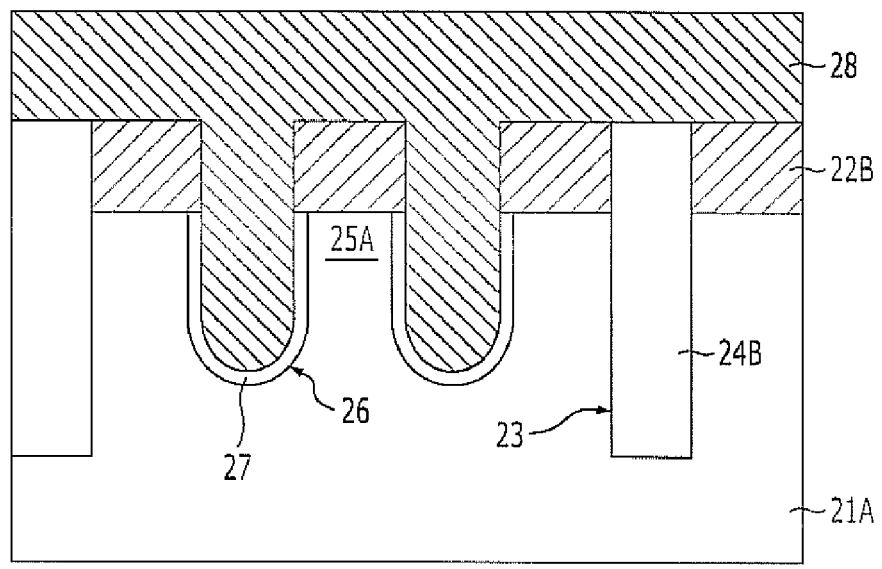
Figure 2F:
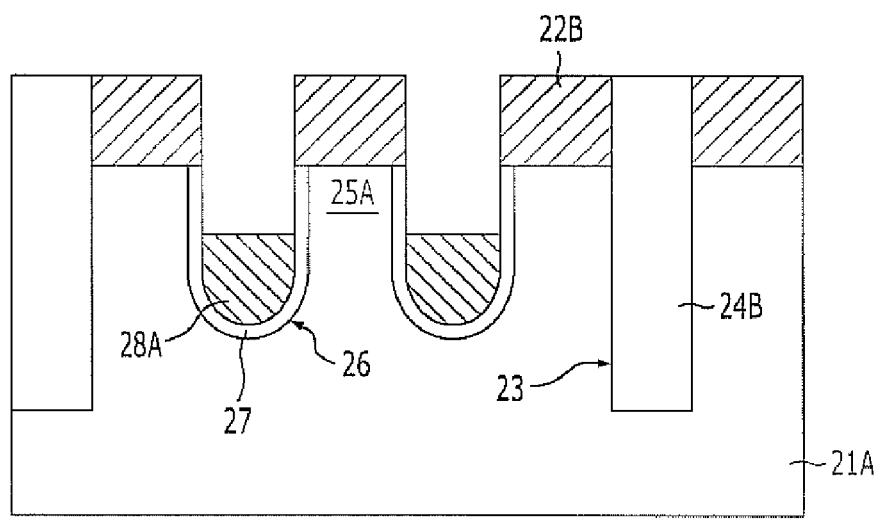
Figure 2G:
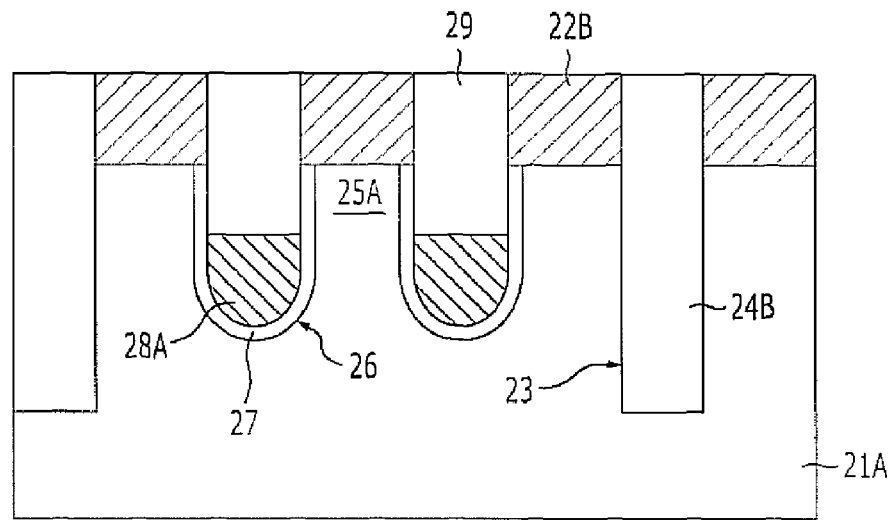
Figure 2H:
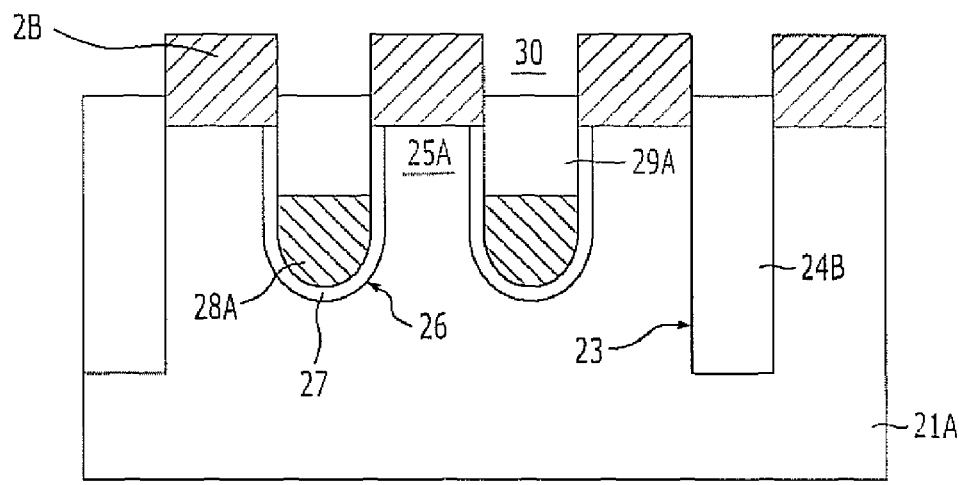
Figure 2I:
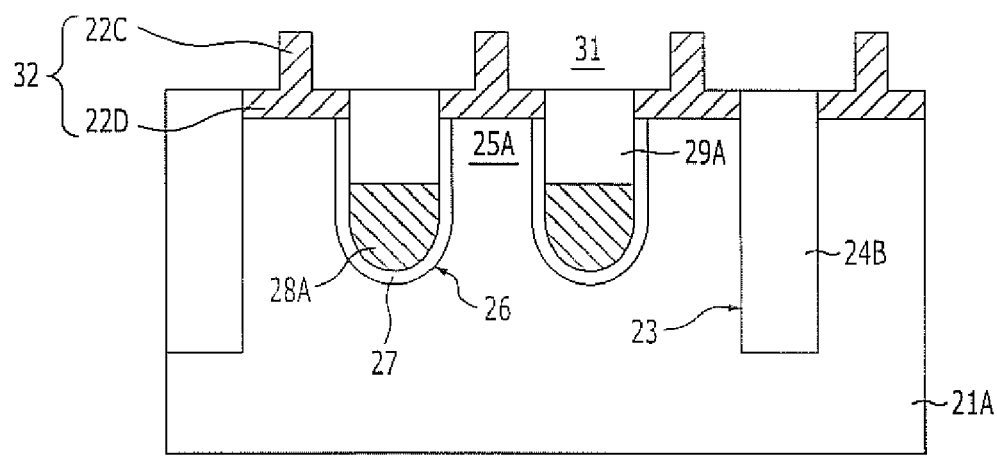
Figure 2J:
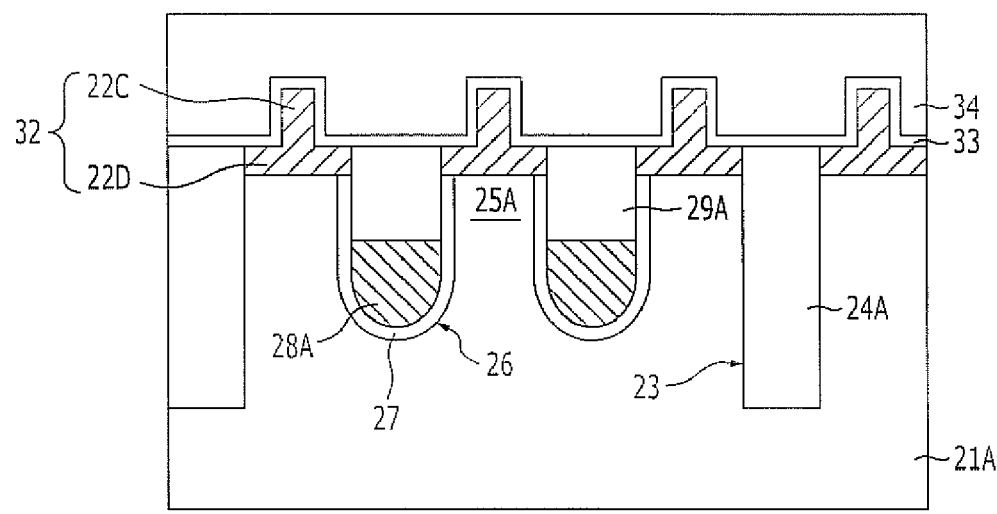
Figure 2K:
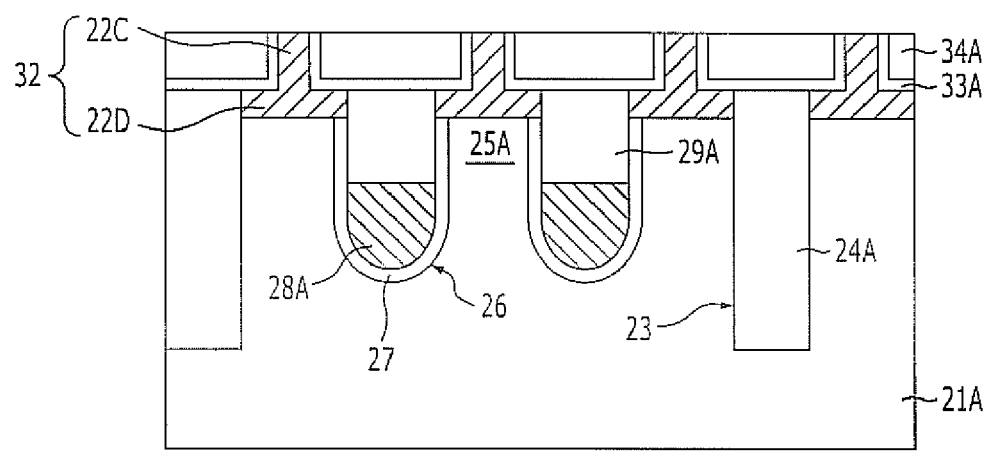
Figure 2L:
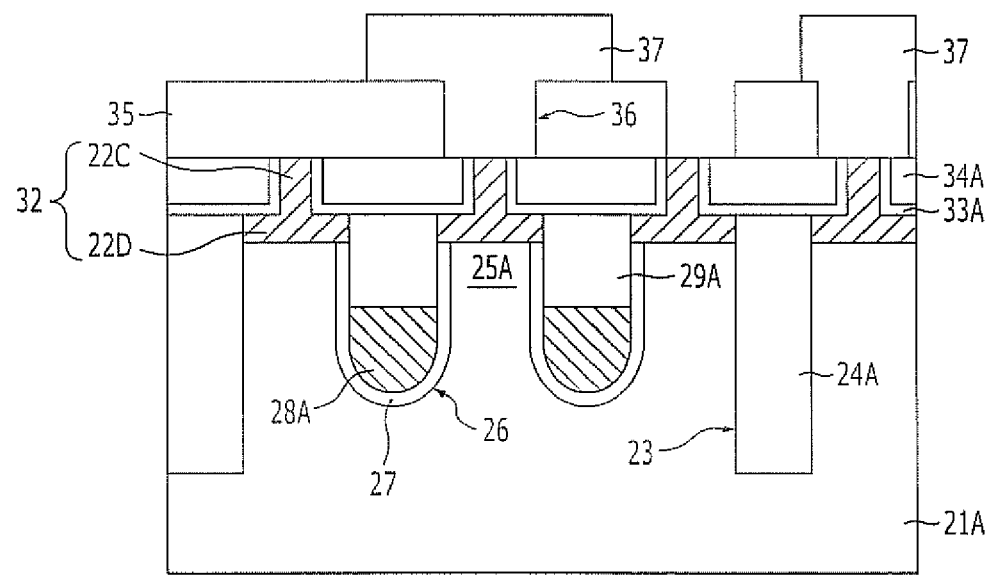
Figure 2M:
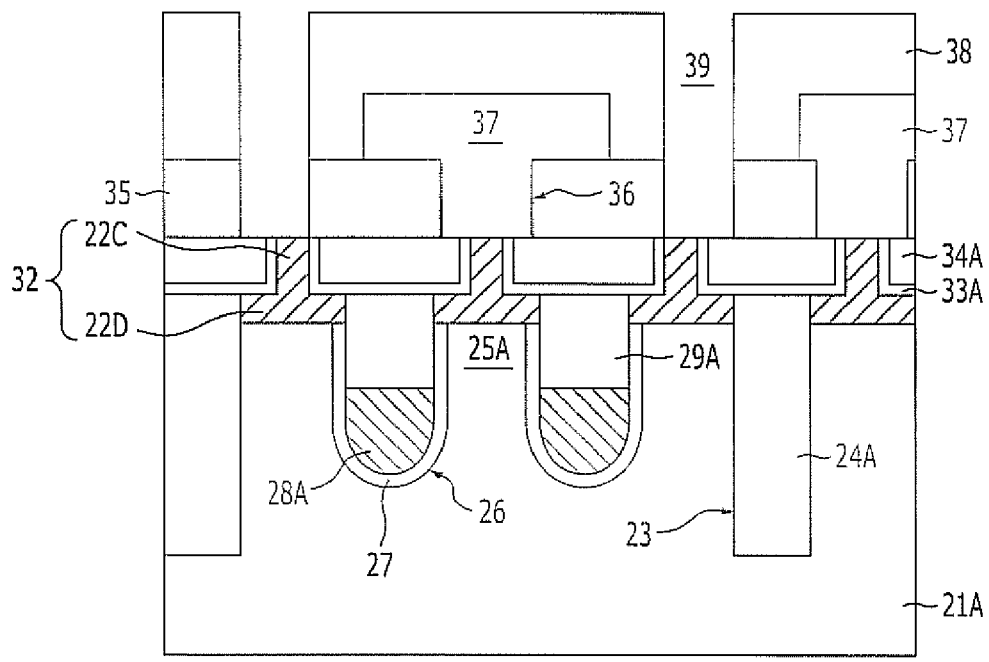
Figure 2N:
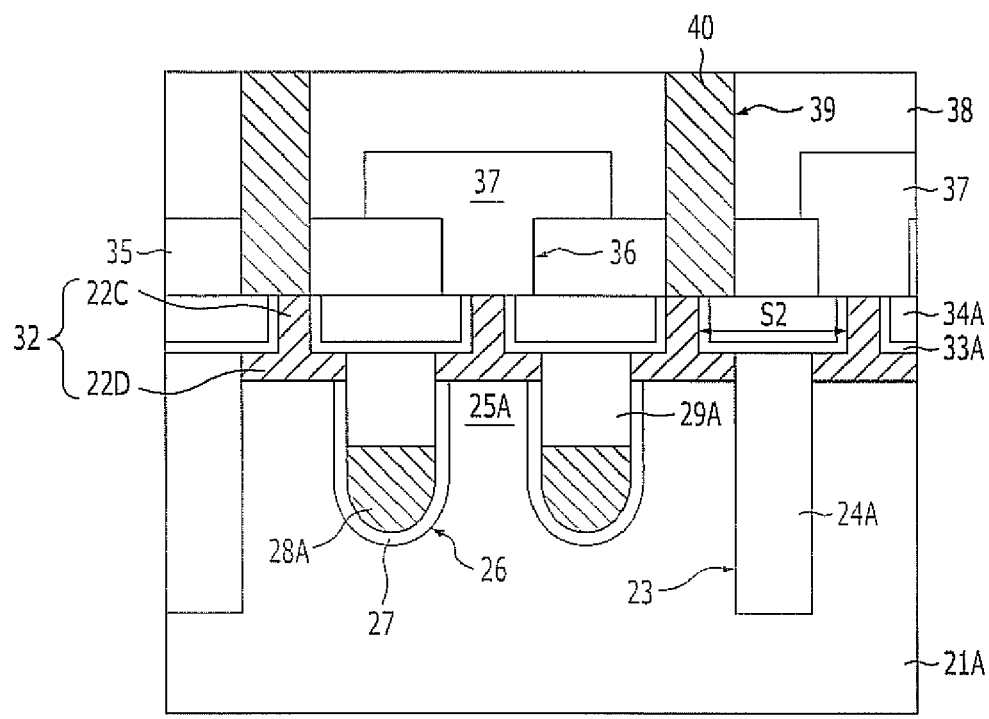

FIGS. 2A to 2N are cross-sectional views illustrating a method for fabricating a semiconductor device in accordance with another exemplary embodiment of the present invention, taken along a line A-A' of FIG. 1.

Referring to FIG. 2A, a first conductive layer 22 may be formed on a substrate 21. The first conductive layer 22 may formed to a thickness of 100 Å to 500 Å. The first conductive layer 22 may include polysilicon.

Referring to FIG. 2B, a shallow trench isolation (STI) process may be performed for device isolation. In the STI process, a first conductive pattern 22A may be formed by etching the first conductive layer 22 using a photoresist pattern (not illustrated). The substrate 21 may then be etched by using the first conductive pattern 22A as an etching barrier. Accordingly, a first trench 23 having a constant depth may be formed in the substrate 21A. The first trench 23 defines an active region 25.

Referring to FIG. 2C, a dielectric layer, such as a spin-on dielectric (SOD), may be formed to gap-fill the first trench 23. A planarization process, such as a chemical mechanical polishing (CMP) process, may then be performed to form a device isolation layer 24 which gap-fills the first trench 23.

Referring to FIG. 2D, a mask and etching process for a buried gate process may then be performed. A plurality of landing plugs 22B may be formed by etching the first conductive pattern 22A using a photoresist pattern (not illustrated), for example. The substrate 21 between the respective landing plugs 22B may then be etched. Accordingly, second trenches 26 having a predetermined depth may be formed in the substrate 21A. The second trenches 26 may be formed by etching the active region 25 and the device isolation layer 24 at the same time. After the second trenches 26 are formed, the active region is represented by reference numeral 25A. Before the photoresist pattern is formed, a buried gate hard mask layer may be formed on the entire surface including the landing plugs 22B. The buried gate hard mask layer may include a nitride layer. The buried gate hard mask layer may be used as an etching barrier for forming the second trenches 26.

The landing plugs 228 may be formed so as to be aligned with the device isolation layer 24. This is referred to as a self-aligned landing plug process. When the self-aligned landing plug process is performed, the height of the landing plugs 22B may be 400 Å or more.

Referring to FIG. 2E, a gate insulation layer 27 may then be formed on the surfaces of the second trenches 26.

A second conductive layer 28 may then be formed on the entire surface including the gate insulation layer 27 so as to gap-fill the second trenches 26. The second conductive layer 28 may include a titanium nitride layer (TIN), a tantalum nitride layer (TaN), or a tungsten layer (W).

Referring to FIG. 2F, the second conductive layer 28 may then be planarized by a CMP process or the like such that the surfaces of the landing plugs 22B are exposed. An etch back process may then be performed to form buried gates 28A to partially fill the second trenches 26.

Referring to FIG. 2G, a first gap-fill layer 29 may then be formed to gap-fill the upper side of the buried gates 28A. The first gap-fill layer 29 may include an oxide layer, a nitride layer, or a multilayered structure consisting of an oxide layer and a nitride layer. For example, a nitride layer may be thinly applied, and an oxide layer, such as SOD, may be formed to gap-fill the upper side of the buried gates 28A.

The first gap-fill layer 29 may then be planarized to expose the surfaces of the landing plugs 22B.

Referring to FIG. 2H, the first gap-fill layer 29 and the device isolation layer 24 may then be recessed to a predetermined depth. Accordingly, a first recess 30 may be formed between the respective landing plugs 22B. A first gap-fill layer 29A and a device isolation layer 24A remain after the first recesses 30 are formed. The landing plugs 22B may partially protrude from the first recesses 30. For example, the landing plugs 22B may protrude from the first recesses 30 by 200 Å or more.

Referring to FIG. 2I, a trimming process may then be performed. The trimming process selectively removes portions of the protruding part of the landing plugs 22B. Accordingly, the landing plugs 22B are formed into landing plugs 32. The trimming process may remove the side portions of the landing plug 22B by 10 Å or more. Each of the landing plugs 32 formed by the trimming process may include a protruding portion 22C and a buried portion 22D. A second recess 31 may then be formed between the respective protruding portions 22C. An isotropic etching process may be used for forming the landing plugs 32. The protruding portion 22C has a structure that may be etched in a side direction by the isotropic etching process. The buried portion 22D has a structure that is buried between the first gap-fill layers 29A. The top surface area of each landing plug 32 is reduced to the protruding portion 22C. Since the buried portion 22D maintains the first area, the contact area between the buried portion 22D and the substrate 21A may be maintained.

In accordance with the above-described exemplary embodiment, the protruding portion 22C and the buried portion 22D of each landing plug 32 may have different areas. Since the area of the buried portion 22D contacting the active region 25A is relatively Large, it is possible to constantly maintain the contact resistance with the active region 25A. On the other hand, since the protruding portion 22C has a relatively small area, the protruding portion 22C may increase an open area between the Landing plug 32 and a bit line contact hole or a storage node contact hole which is to be formed in a subsequent process.

The landing plugs 32 include a landing plug to be connected to a bit line contact and a landing plug to be connected to a storage node contact. Therefore, the landing plug 32 to be connected to a bit line contact may be formed in the center of the active region 25A, and the landing plug 32 to be connected to a storage node contact may be formed on both sides of the center of the active region 25A. Accordingly, the landing plug 32 to be connected to a bit line contact may have the same shape as the landing plug 32 to be connected to a storage node contact.

Referring to FIG. 2J, a spacer dielectric layer 33 may then be formed on the entire surface including the landing plugs 32, and a second gap-fill layer 34 may then be formed on the spacer dielectric layer 33 so as to gap-fill the space between the landing plugs 32. The spacer dielectric layer 33 may include a nitride layer. The spacer dielectric layer 33 may be formed to a thickness of 100 Å or more. The second gap-fill layer 34 may include an oxide layer, such as SOD.

Referring to FIG. 2K, a planarization process may then be performed until the surfaces of the protruding portions of the landing plugs 32 are exposed. During the planarization process, the second gap-fill layer 34 and the spacer dielectric layer 33 may also be planarized. Accordingly, the spacer 33A and the second gap-fill layer 34A remain between the landing plugs 32. The spacer 33A serves to prevent a bridge between contacts during a subsequent bit line contact process or storage node contact process. Furthermore, the spacer 33A prevents the landing plugs 32 from being damaged by a subsequent process.

Referring to FIG. 2L, a first interlayer dielectric layer 35 may then be formed on the entire surface. Before the first interlayer dielectric layer 35 is formed, an etching stop layer may be formed. The etching stop layer may then be formed to a thickness of 100 Å or more by using a nitride layer, for example.

The first interlayer dielectric layer 35 may then be etched to form a bit line contact hole exposing one of the landing plugs 32. A bit line 37 may then be formed to be connected to the exposed landing plug 32 through the bit line contact hole 36. The exposed landing plug 32 corresponds to a landing plug formed in the center of the active region 25A between the buried gates 28A, as seen in FIG. 2L. The bit line 37 may be formed in a direction crossing the buried gate 28A. A portion of the bit line 37, which is buried in the bit line contact hole 36, becomes a bit line contact.

Referring to FIG. 2M, a second interlayer dielectric layer 38 may then be formed on the entire surface including the bit line 37, and a storage node contact hole 39 may then be formed to expose one of the landing plugs 32. The exposed landing plug 32 corresponds to a landing plug formed on both sides of the center of the active region 25A, as seen in FIG. 2M.

Referring to FIG. 2N, a storage node contact 40 may then be formed to fill the storage node contact hole 39.

Since the space S2 between the landing plugs 32 may be increased by the protruding portions 22C, a process margin for preventing a bridge between the bit line 37 and the storage node contact 40 may be improved.

The semiconductor device having the storage node contact 40 formed therein includes the substrate 21A having the trenches 26 formed therein, the buried gates 28A partially filling the trenches 26, the first gap-fill layers 29A which may be formed on the buried gates 28A so as to protrude from the surface of the substrate 21A, and the landing plugs 32 each having the buried portion 22D formed on the substrate 21A between the first gap-fill layers 29A and the protruding portion 22C formed on the buried portion 22D. The protruding portion 22C may have a smaller area than the buried portion 22D. The landing plug 32 may include a polysilicon layer. The semiconductor device may include the bit line contact or the storage node contact 40 formed on the landing plug 32. The bit line contact is a portion of the bit line 37 which is buried in the bit line contact hole 36.

Figure 3A:
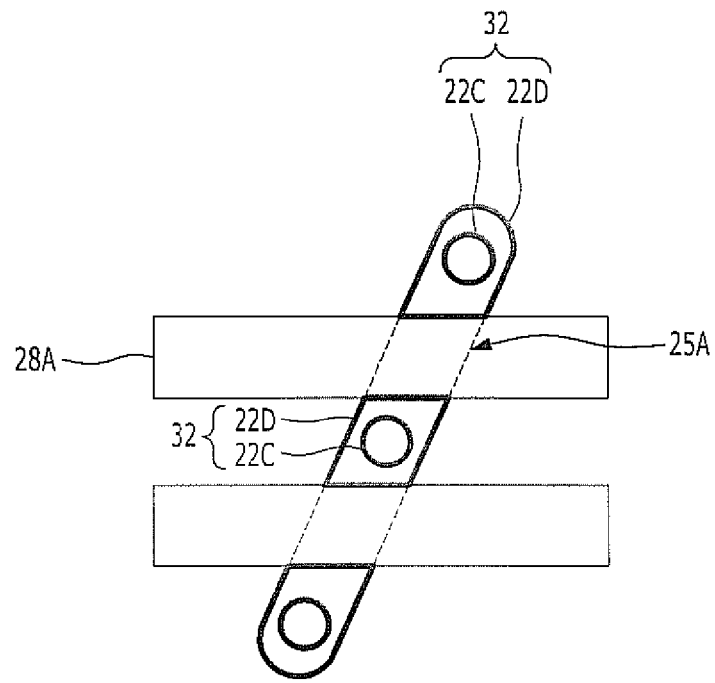
FIG. 3A is a plan view of a buried gate and a landing plug.
Figure 3B:
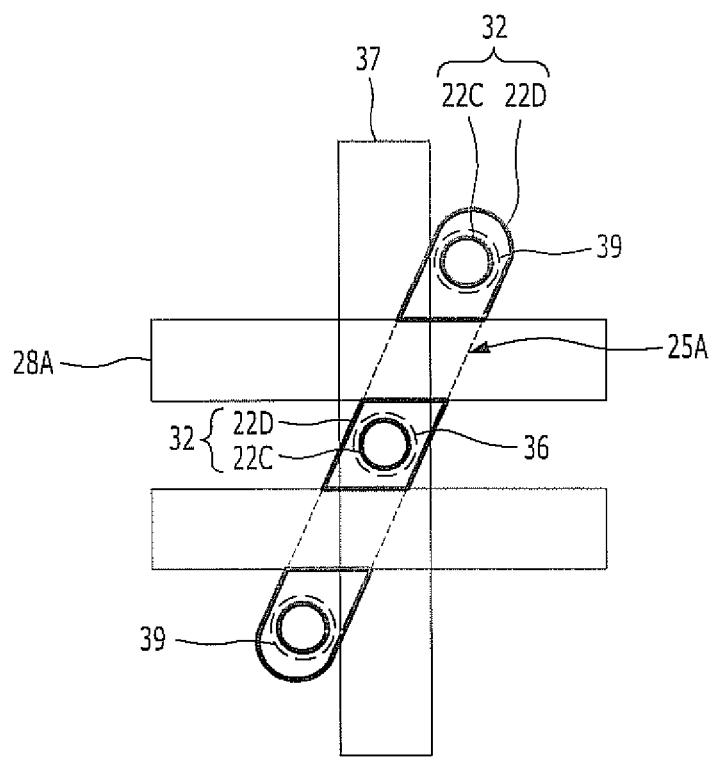
FIG. 3B is a plan view of the buried gate and the landing plug including a bit line.

FIG. 3A is a plan view of the buried gate and the landing plug. FIG. 3B is a plan view of the buried gate and the landing plug including the bit line.

Referring to FIGS. 3A and 3B, the buried gate 28A may be formed in the active region 25A, and the landing plugs 32 may be formed on the active region 25A. The landing plugs 32 do not overlap the buried gate 28A. Each of the landing plugs 32 has the protruding portion 22C and the buried portion 22D. The bit line 37 may cross the buried gate 28A at right angles. A portion of the bit line 37 may be buried in the bit line contact hole 36 and connected to one of the landing plugs 32, and the storage node contact holes 39 may be formed over the other landing plugs 32.

In accordance with the above-described exemplary embodiment of the present invention, the landing plugs 32 having the protruding portions 22 with a small area may be formed by the trimming process. Therefore, the bridge between the bit line contact hole 36 and the storage node contact hole 39 may be minimized. Accordingly, the process margin of the bit line contact hole 36 and the storage node contact hole 39 may be improved. Furthermore, since the landing plugs 32 having the protruding portions 22C with a relatively small area are formed, the open area between the bit line contact hole 36 and the landing plug 32 or the open area between the storage node contact hole 39 and the landing plug 32 may be increased.

Furthermore, the storage node contact hole 39 and the storage node contact 40 are formed after the bit line 37 is formed. The bit line 37 and the storage node contact 40 are all formed in the cell region.

In accordance with another exemplary embodiment of the present invention, a gate of a peripheral circuit region may be formed at the same time that a bit line is formed.

In accordance with still another exemplary embodiment of the present invention, an interlayer dielectric layer may be formed after a gate of a peripheral circuit region is formed. Then, a storage node contact may be formed, and a bit line may be formed by a Damascene process.

When the bit line contact hole or the storage node contact hole is formed, the process may be stopped by the etching stop layer, and an additional etching process may be performed to form the contact hole. The additional etching process promotes the etching of the nitride layer. Accordingly, the nitride layer used as the spacer 33A may be partially removed to increase the open area between the bit line contact hole and the landing plug or the open area between the storage node contact hole and the landing plug. Furthermore, a loss of the active region may be prevented.

In the above-described embodiment of the present invention, the landing plugs 22B are first formed, and the buried gates 28A are then formed. Accordingly, the open margins of the bit line contact hole 36 and the storage node contact hole 39 may be improved, and the contact resistance to the active region 25A may be reduced.

In accordance with the exemplary embodiments of the present invention, since the landing plugs having the protruding portions with a small area and the buried portions with a large area may be formed by the trimming process, it may be possible to prevent a bridge between the bit line contact hole and the storage node contact hole. Accordingly, the process margin of the bit line contact hole and storage node contact hole process may be improved. Furthermore, since the contact area between the landing plug and the active region may be increased by the buried portion having a large area, it may be possible to uniformly maintain contact resistance.

While the present invention has been described with respect to the specific embodiments, it will be apparent to those skilled in the art that various changes and modifications may be made without departing from the spirit and scope of the invention as defined by the following claims.

What is claimed is:

1. A method for fabricating a semiconductor device, comprising:
    forming a plurality of landing plugs over a substrate;
    forming a trench by etching the substrate between the plurality of landing plugs;
    forming a buried gate to partially fill the trench;

forming a gap-fill layer to gap-fill an upper side of the buried gate;
forming protruding portions of the plurality of landing plugs; and
trimming the protruding portions of the plurality of landing plugs.

2. The method of claim 1, further comprising forming a contact hole to expose a respective one of the plurality of trimmed landing plugs.

3. The method of claim 2, wherein forming the contact hole comprises forming both a bit line contact hole and a storage node contact hole.

4. The method of claim 1, wherein the trimming of the protruding portions of the plurality of landing plugs comprises performing an isotropic etching process.

5. The method of claim 1, wherein forming the plurality of landing plugs comprises forming a polysilicon layer.

6. The method of claim 1, wherein the forming of the protruding portions of the plurality of landing plugs comprises recessing the gap-fill layer.

7. A method for fabricating a semiconductor device, comprising:
forming a plurality of landing plugs over a substrate;
forming a trench by etching the substrate between the plurality of landing plugs;
forming a buried gate to partially fill the trench;
forming a first gap-fill layer to gap-fill an upper side of the buried gate;
forming protruding portions of the plurality of landing plugs;
trimming the protruding portions of the plurality of landing plugs;
forming a spacer dielectric layer over an entire surface of the trimmed plurality of landing plugs;
forming a second gap-fill layer over the spacer dielectric layer; and
planarizing the second gap-fill layer and the spacer dielectric layer to expose the surfaces of the trimmed plurality of landing plugs.

8. The method of claim 7, further comprising forming a contact hole to expose a surface a respective one of the plurality of landing plugs, after the planarizing of the second gap-fill layer and the spacer dielectric layer.

9. The method of claim 8, wherein forming the contact hole to comprises forming both a bit Line contact hole and a storage node contact hole.

10. The method of claim 7, wherein the trimming of the protruding portions of the plurality of landing plugs comprises performing an isotropic etching process.

11. The method of claim 7, wherein forming the plurality of landing plugs comprises forming a polysilicon layer.

12. The method of claim 7, wherein the forming of the protruding portions of the plurality of landing plugs comprises recessing the first gap-fill layer.

* * * * *